United States Patent [19]

Koike et al.

[11] 4,223,330
[45] Sep. 16, 1980

[54] SOLID-STATE IMAGING DEVICE

[75] Inventors: Norio Koike, Tokyo; Iwao Takemoto, Kodaira; Shinya Ohba, Kokubunji; Masaharu Kubo, Hachioji; Shuhei Tanaka, Higashiyamato, all of Japan

[73] Assignees: Hitachi, Ltd.; Hitachi Denshi Kabushiki Kaisha, both of Japan

[21] Appl. No.: 5,567

[22] Filed: Jan. 22, 1979

[30] Foreign Application Priority Data

Jan. 23, 1978 [JP] Japan .................. 53-5224

[51] Int. Cl.² .............. H01L 27/14; H01L 29/78
[52] U.S. Cl. ............................. 357/32; 357/31; 357/30; 357/23; 250/211 J; 307/311
[58] Field of Search ............. 357/32, 31, 30, 23; 250/211 J; 307/311

[56] References Cited

U.S. PATENT DOCUMENTS

| 3,660,667 | 5/1972 | Weimer | 250/209 |
| 3,683,193 | 8/1972 | Weimer | 250/209 |
| 4,148,048 | 4/1979 | Takemoto | 57/30 |
| 4,148,051 | 4/1979 | Koike | 357/30 |
| 4,155,006 | 5/1979 | Sato | 250/211 J |
| 4,155,094 | 5/1979 | Ohba | 357/30 |
| 6,143,389 | 3/1979 | Koike | 357/31 |

Primary Examiner—Martin H. Edlow
Attorney, Agent, or Firm—Craig & Antonelli

[57] ABSTRACT

In a solid-state imaging device having, in one major surface region of a semiconductor substrate, photoelectric conversion elements which are disposed in a two-dimensional array, vertical switching metal-insulator-semiconductor field effect transistors and horizontal switching metal-insulator-semiconductor field effect transistors which select the photoelectric conversion elements, and vertical and horizontal scanning circuits which turn the switching transistors "on" and "off," a solid-state imaging device characterized in that the vertical switching metal-insulator-semiconductor field effect transistors which are not selected are placed into a deeper cutoff state, i.e., the major surface regions of the semiconductor substrate corresponding to gate electrodes of these vertical switching metal-insulator-semiconductor field effect transistors are placed at an accumulation level.

12 Claims, 12 Drawing Figures

SOLID-STATE IMAGING DEVICE

BACKGROUND OF THE INVENTION

1. Field of the Invention

This invention relates to a solid-state image pickup device for use in a television camera, etc. Particularly it relates to a solid-state imaging device which has a plurality of picture elements and horizontal and vertical scanning circuits, which are disposed in a major surface region of a semiconductor body.

More specifically, it relates to a solid-state device which has picture elements for reading out from photodiodes optical information stored therein.

2. Description of the Prior Art

A solid-state imaging device for use in a television camera must possess a resolution equivalent to that of an image pickup tube used in present day television broadcasting. Therefore, it requires about 500×500 photoelectric conversion elements, switching transistors for X-Y addressing which correspond to the photoelectric conversion elements, and an X-scanner and a Y-scanner which turn the switching transistors "on" and "off" and each of which consists of about 500 stages. Accordingly, the solid-state image pickup device is usually fabricated by MOS LSI technology which can realize a high integration density comparatively easily.

FIG. 1 is a diagram for explaining the configuration of such a solid-state imaging device. Referring to the figure, numeral 1 designates a horizontal scanning circuit for X or column addressing, while numeral 2 designates a vertical scanning circuit for Y or row addressing. Numeral 3 designates a vertical switching transistor which is turned "on" or "off" by the circuit 2 and which is formed of a metal-oxide-semiconductor field effect transistor (hereinbelow, abbreviated to "MOST"). Numeral 4 designates a photodiode which employs the source junction of the switching transistor 3. Shown at 5 is a vertical output line to which the drains of the switching transistors 3 are connected in common. Numeral 6 indicates a horizontal switching transistor which is turned "on" or "off" by the horizontal scanning circuit. It is formed of a MOST, the drain of which is connected to a horizontal output line 7 and the source of which is connected to the vertical output line 5. A video voltage source 8 is connected to the horizontal output line 7 through a resistor 9. The two horizontal and vertical scanning circuits turn the switching transistors 6 and 3 "on" and "off" in succession, to read out an image or video signal through the resistor 9 comprised of photo-currents from the photodiodes which are arrayed in two dimensions. Since the signals from the photodiodes correspond to the optical image of an object projected thereon, a video signal can be derived by the above operation. A feature of this type of solid-state imaging device is its easy integration since the sources of the switching MOSTs can be utilized for photoelectric conversion and MOS shift registers can also be utilized for scanning circuits.

The solid-state imaging device above described, however, involves the problem that charges generated by photo-excitation in the region of intense incident light overflow to surrounding regions with the result that white spots reflecting diffusion spread on a monitor and that a white vertical stripe appears. The white spot of the former corresponds to a case where overflow charges have diffused into the adjacent photodiode, while the vertical stripe of the latter corresponds to a case where the charges have diffused into the vertical output line. The vertical stripe is a reproduced image which is not included in the actual optical image, and hence, it gives an unnatural impression. This phenomenon is generally called "blooming," and is a serious factor hampering the practicability of the solid-state imaging device. For example, the device cannot be used in natural daylight where the intensity of incident light is high. Even in the interior of a house, the blooming phenomenon occurs when the images of a metal having high reflection factor, a white object, etc. are picked up. Therefore, the places of use are limited severely.

As a result of empirical measurements with an area sensor, the inventors have found that the blooming is attributed to a cause as described hereunder. FIG. 2A shows the sectional structure of a picture element which forms a unit of the construction shown in FIG. 1. Numeral 10 designates a semiconductor body of a first conductivity type (e.g., P-type conductivity) in which the elements are integrated. Numeral 11 designates a vertical switching MOST which is formed of an insulating film 12, a gate electrode 13, a source 14 and a drain 15. The source and drain are made of diffusion layers of an impurity of a second conductivity type (e.g., N-type conductivity). The source junction (NP-junction) is utilized as a photodiode. The drain is connected to an aluminum (Al) interconnection 16 for a vertical output line.

FIGS. 2B, 2C and 2D are energy band diagrams corresponding to FIG. 2A. In the diagrams, "C.B." indicates electrons or signifies the conduction band, and "V.B." designates holes or signifies the valence band.

When the switching MOST 11 is rendered conductive by a pulse of level "1" provided by the vertical scanner, the photodiode 14 is charged up to a video voltage Vv by the video voltage source 8. When the pulse returns to level "0," the voltage of the diode reverse-biased by the photo-excited carriers in response to incident light is discharged. In the initial state in which the discharge commences, the potentials of the photodiode and the drain have the characteristic illustrated in FIG. 2B. Here, Vb indicates a built-in voltage (in general, about +0.8 V) which is formed by the diode junction. Vp("0") denotes the "0" level voltage of the scan pulse, and this voltage corresponds to the design value 0.5 V–1.0 V of a polarity inverting circuit constituting the scanner. When the potential of the photodiode is increased by −0.5 V−−1.0 V, the diode voltage is discharged according to the quantity of incident light, and the potential Vv' (Vv'<Vv) of the diode (layer 14) diminishes (FIG. 2C). When the quantity of light further increases, the diode potential Vv" (Vv"<Vv') exceeds the potential of the semiconductor body (FIG. 2D), and the electrons generated in the diode pass a portion underlying the gate of the MOST 11 and flow into the drain 15 connected with the signal output line.

On the other hand, the potential of the drain 15 remains at the potential Vv+Vb−Vp("0") throughout all of these periods because the parasitic capacitance of the vertical output line with the drains connected thereto in common is several tens times greater than the charge storage capacitance of the photodiode and is charged up to the video voltage every horizontal scan period. Accordingly, the drain or the vertical output line acts as a storage capacitance which absorbs charges that cannot be stored in the diode in consequence of the increase of the potential of the diode, and it gives rise to blooming.

SUMMARY OF THE INVENTION

The present invention makes improvements in the prior-art solid-state imaging device described above.

That is, an object of the invention is to provide a solid-state imaging device which includes means for suppressing blooming that is attributable to the incidence of intense light.

The solid-state imaging device of the invention is a solid-state imaging device having in one major surface of a semiconductor substrate of one conductivity type photoelectric conversion elements which are arrayed in two dimensions, vertical switching MOS field effect transistors and horizontal switching MOS field effect transistors which select the photoelectric conversion elements, and vertical and horizontal scanning circuits which turn the switching transistors "on" and "off," characterized in that the vertical switching MOS field effect transistors which are not selected are placed into a deeper cutoff state; that is, the major surface of the semiconductor substrate corresponding to portions underlying gate electrodes of these vertical switching MOS field effect transistors are placed at an accumulation level.

BRIEF DESCRIPTION OF THE DRAWINGS

FIGS. 2B, 2C and 2D are diagrams of energy bands in the picture element shown in FIG. 2A, among which FIG. 2B shows the initial state of the photodiode, FIG. 2C shows the discharged state of the photodiode, and FIG. 2D shows the state at the occurrence of blooming.

DESCRIPTION OF THE PREFERRED EMBODIMENTS

Hereunder, this invention will be described in detail with reference to embodiments thereof.

While imaging devices composed of N-channel type MOSTs will be explained for the following embodiments, the same explanation applies to imaging devices composed of P-channel type MOSTs by inverting various voltages to be impressed and the polarities of conductivity types. Moreover, while MOSTs will be referred to in the following explanation, the invention can be expanded to metal-insulator-semiconductor field effect transistors (MIS FETs) in which an insulating film (of, e.g., $Si_3N_4$) other than an oxide film is employed as a gate insulating film.

EMBODIMENT 1

Figure 3:
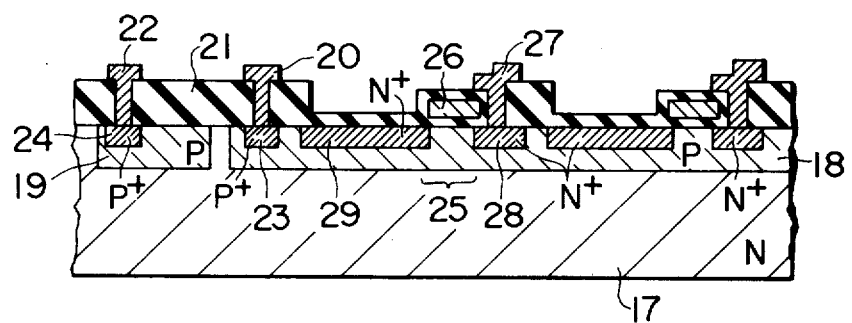
FIG. 3 is a sectional view showing the structure of a picture element of a solid-state imaging device for a first embodiment of the invention.
Figure 2A:
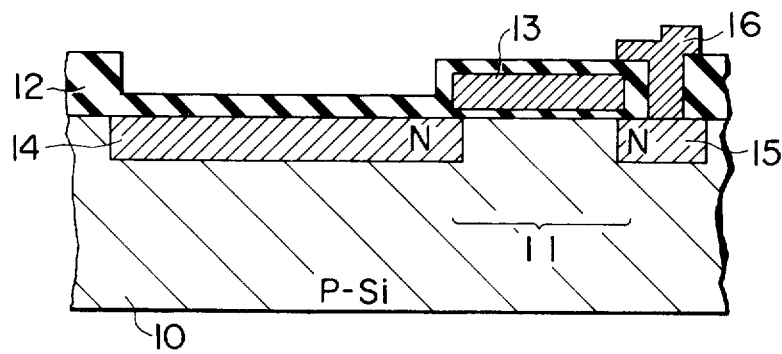
FIG. 2A is a sectional view showing the structure of a picture element (photodiode and vertical switching MOST) of a prior-art solid-state imaging device.
Figure 2B:
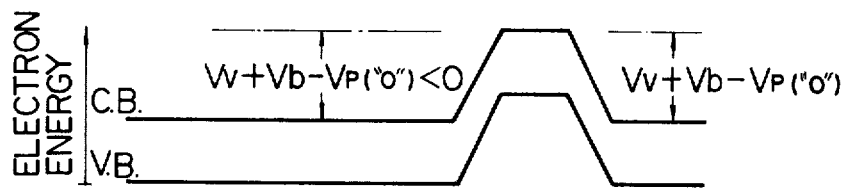
Figure 2C:
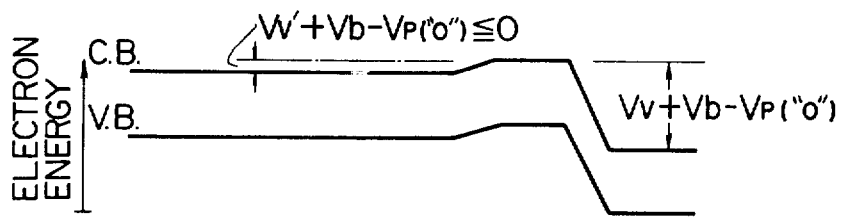
Figure 2D:
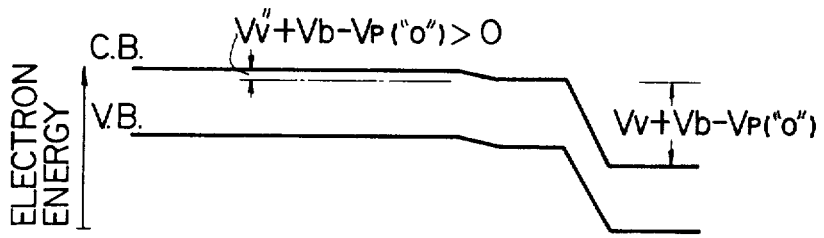

FIG. 3 shows a solid-state imaging device for a first embodiment according to the invention. Numeral 17 designates a silicon (Si) substrate of N-type conductivity. Numerals 18 and 19 designate layers of P-type conductivity diffused as wells which are formed in a surface region of the substrate 17. Well 18 serves to integrate selecting switching transistors and photodiodes therein and the well 19 serves to integrate scanning circuits therein. Shown at 20 and 22 are electrodes (usually made of Al) for setting the respective P-type diffusion layers 18 and 19 at predetermined voltages. The electrodes 20 and 22 lie in contact with P-type diffused layers 23 and 24 of higher impurity concentration than the P-type diffused layers 18 and 19 through etched holes provided in parts of an insulating film 21, respectively. A MOST 25 is a vertical switching MOST which is formed of a gate electrode 26 (ordinarily made of polycrystalline silicon), a drain 28 connected with a signal output line 27 (ordinarily made of Al), and a source 29. The source 29 of the MOST 25 is used as a photodiode. Here, the drain 28 and the source 29 are formed of N-type diffused layers of higher impurity concentration than the well diffused layers of P-type conductivity. The photodiode 29 and the MOST 25 constitute one picture element.

The blooming suppressing effect of the present imaging device will now be explained. Since the P-type diffusion well 19 in which the scanning circuits are integrated is not related to the suppression of blooming, usually ground voltage (O V) is applied thereto through the electrode 22. In contrast, the P-type diffusion well 18 in which the photodiode is integrated has a plus or positive voltage Va applied thereto in order to place a portion underneath the gate electrode of the vertical switching MOST at an accumulation level.

However, the voltage Va must be lower than the video voltage Vv in order that the junctions between the well and the source 29 serving as the photodiode and the drain 28 for providing a signal may be prevented from becoming forward-biased. Further, a positive voltage higher than the voltage applied to the P-type diffused well 18 is applied to the substrate 17 in order to put the junction between the well 18 and the substrate 17 into a reverse-biased state (an electrode for applying the voltage to the substrate is omitted in the figure). Accordingly, energy for electrons underneath the gate electrode as compared with the corresponding energy in the photodiode becomes higher by a voltage $\delta Vw$ even where the photodiode has been perfectly discharged by incident light.

$$\delta Vw = Va + Vb - Vp(\text{``0''}) \tag{1}$$

When selecting the voltage Va at +0.5 V and the values of Vb and Vp ("0") at 0.8 V and 1.0 V being the most common, respectively, the voltage δVw becomes 0.3 V from Eq. (1). On the other hand, the number $n_e$ electrons which overcome the voltage δVw and flow into the signal delivering drain 28 through the portion underlying the gate electrode 26 is given by the following equation, where $n_o$ denotes the number of electrons generated in the photodiode 29:

$$n_e = n_o \exp\left(-\frac{\delta V_w}{KT}\right) \quad (2)$$

where k denotes Boltzmann's constant, and T is absolute temperature. Under the conditions δVw=0.3 V and room temperature (T≈300° K), the number of inflowing electrons relative to the number of generated electrons (or $n_e/n_o$) is evaluated from Eq. (2) to be $4.5 \times 10^{-4}$. By applying a plus voltage of about 05. V to the well according to the invention, accordingly, the number of electrons which flow into the signal delivering drain can be reduced to approximately 1/10,000 of the number in the prior art, and it becomes possible to conspicuously prevent the occurrence of the blooming phenomenon.

When the impurity concentration of the substrate in the imaging device described above is approximately $10^{15}$ atoms/cm$^3$, it is desirable that the P-type impurity concentration of the wells 18 and 19 be $3 \times 10^{15} - 5 \times 10^{16}$ atoms/cm$^3$, the impurity concentration of the P-type diffused layers 23 and 24 be $\sim 10^{18}$ atoms/cm$^3$ for establishing sufficient contacts with the respective electrodes 20 and 22, and that the N-type impurity concentration of the source and the drain be $10^{19}-10^{20}$ atoms/cm$^3$. These values are numerical values presently used in the manufacturing processes of complementary MOS ICs, and the present imaging device can be readily fabricated by the manufacturing processes of the complementary MOS devices.

In the first embodiment, the scanning circuit and the photodiode has been integrated in separate wells provided in the same substrate so as not to reduce the performance of the scanning circuit. However, blooming can be suppressed even when the wells are not provided and both the scanning circuit and the photodiode are integrated in a substrate of P-type conductivity. In this case, a plus voltage is applied to the substrate. The junction between the source or drain forming the scanning circuit and the substrate must not be forward-biased, and the upper limit of the applied voltage cannot exceed the built-in voltage (about 0.8 V). Accordingly, the structure of the imaging device is simpler than the well structure in FIG. 3, and the manufacture is facilitated to that extent. However, the effect of suppressing blooming decreases.

EMBODIMENT 2

In the foregoing embodiment 1, blooming is suppressed by applying a positive voltage to the well formed in the substrate or to the substrate itself. A similar suppression of blooming can be achieved even when, conversely to the foregoing system, a negative voltage is applied to the gate electrode of the vertical switching MOST, that is, the "0" level voltage of the scan pulse which the vertical scanner provides is made a negative voltage with respect to the substrate.

Figure 4A:
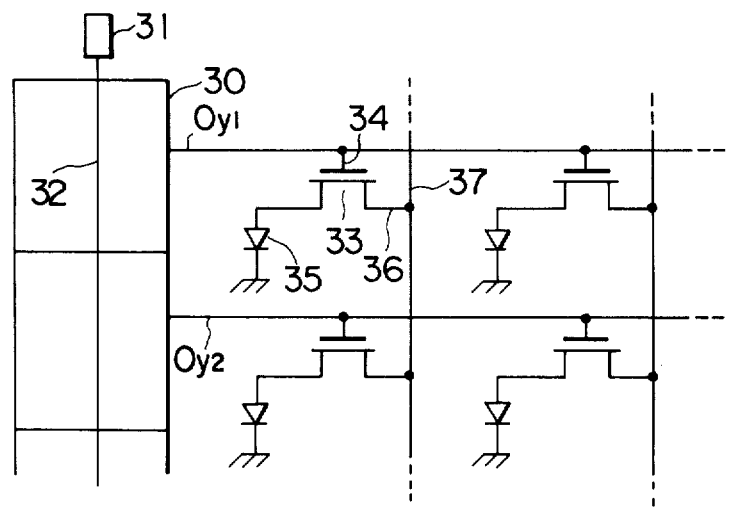
FIG. 4A is a schematic circuit diagram showing the construction of a solid-state imaging device for a second embodiment of the invention.
Figure 4B:
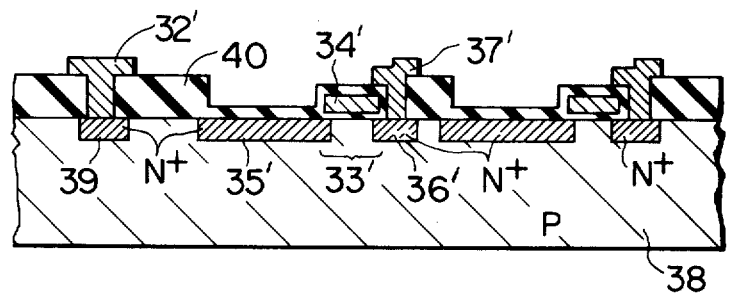
FIG. 4B is a sectional view showing the structure of a picture element of the solid-state imaging device for the second embodiment of the invention.

FIGS. 4A–4D illustrate another construction and structure of the solid-state imaging device according to the invention. In FIG. 4A, numeral 30 designates a vertical scanning circuit, numeral 31 a reference voltage source for the circuit 30, and numeral 32 an interconnection for applying a reference voltage. MOSTs 33 are vertical switching MOSTs whose gates 34 are connected to output lines $O_{y1}$, $O_{y2}$ . . . of the respective stages of the scanning circuit. A diode 35 is a photodiode which utilizes the source of the switching transistor 33. Numeral 36 designates the drains of the switching MOSTs 33, and they are connected to a vertical output line 37 in common. FIG. 4B shows the sectional structure (i.e., integrated circuit structure) of the circuit arrangement shown in FIG. 4A. MOST 33 is a vertical switching MOST, which has a gate electrode 34' (ordinarily made of polycrystalline silicon). Shown at 35' is a source which is formed of a diffused layer having a conductivity type (e.g., N-type) opposite to that of a substrate 38 (e.g., P-type silicon substrate) and which constitutes a photodiode. Shown at 36' is a drain which is formed of a diffused layer having the same conductivity type as that of the diode region and which is connected to a vertical output line (usually made of aluminum) 37'. Symbol 32' indicates an interconnection layer for applying a reference voltage (usually made of aluminum), and this interconnection layer is connected with an N-type diffused layer 39 which serves as the source (or drain) of a MOST (refer to FIG. 4C) constituting the vertical scanner 30. Numeral 40 indicates an insulating film (of SiO$_2$ or the like).

Figure 4C:
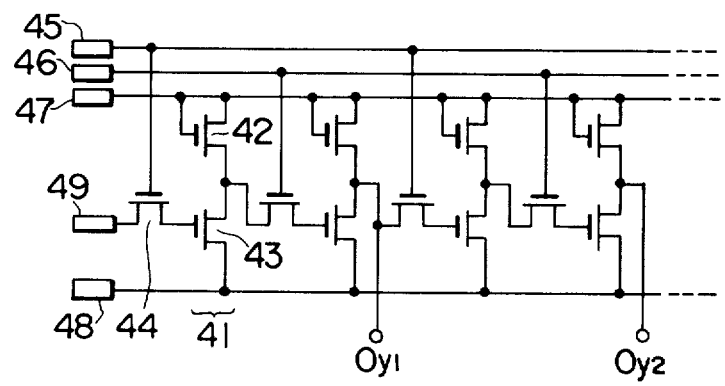
FIG. 4C is a schematic circuit diagram showing an example of a vertical scanning circuit for use in the solid-state imaging device for the second embodiment of the invention.
Figure 4D:
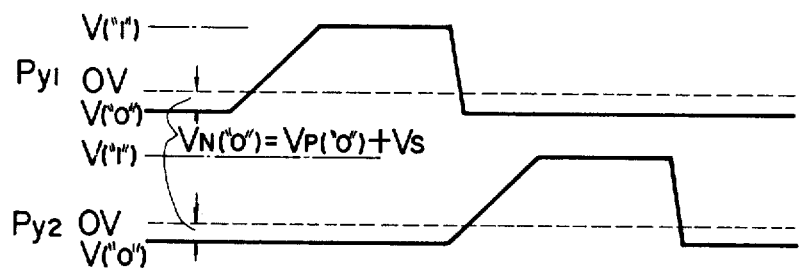
FIG. 4D is a diagram showing scan pulse outputs from the scanning circuit of FIG. 4C for use in the solid-state imaging device for the second embodiment of the invention.

FIG. 4C shows an example of the vertical scanning circuit 30 illustrated in FIG. 4A. Numeral 41 represents a polarity inverting circuit which is formed of a series connection consisting of a load MOST 42 and a driver MOST 43. A MOST 44 is a transfer MOST which is turned "on" and "off" by two phases of clock pulses that are generated by clock pulse generators 45 and 46. Numeral 47 designates a voltage source which drives the load MOSTs and which controls the "1" level voltage of the scan pulses obtained from the outputs $O_{y1}$, $O_{y2}$ . . . of the respective stages. Numeral 48 represents a reference voltage source, which is connected to the sources (or drains) of the driver MOSTs in common and which sets a new "0" level voltage VN("0") of the scan pulses. An input pulse generated by an input pulse generator 49 is entered into the transfer MOST 44 of the first stage of the circuit. By impressing the clock pulses on the respective stages of the scanning circuit, the input pulse is changed into the scan pulses $P_{y1}$, $P_{y2}$, . . . which are delayed every period of the clock pulse and which are obtained from the outputs $O_{y1}$, $O_{y2}$, . . . of the respective stages (FIG. 4D). Here, the rise time conforms with a charging waveform owing to the load MOST of low $g_m$ (mutual conductance), and the fall time conforms with a discharging waveform owing to the driver MOST of high $g_m$. The "1" level voltage is equal to a value obtained by subtracting the threshold voltage VT of the load MOST from the voltage Vdd supplied by the voltage source 47. Letting $\beta_R$ denote the $g_m$ ratio between the driver MOST and the load MOST, the "0" level voltage Vp("0") is given by the following equation:

$$V_p("0") = V_{dd} \times (1/\beta_R) \quad (3)$$

Figure 4E:
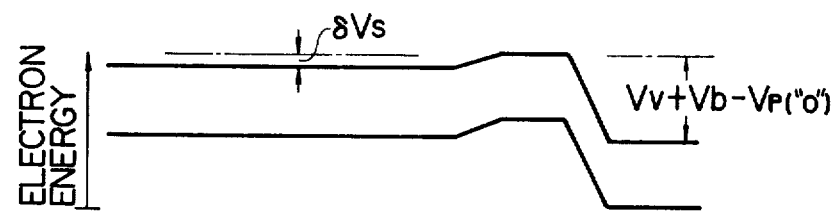
FIG. 4E is a diagram of energy bands in the picture element of the solid-state imaging device for the second embodiment of the invention, and shows the discharged state of a photodiode.

In general, Vdd is about 10 V and $\beta_R$ is about 10 to 20 V, so that the voltage Vp("0") increases from 0 V by approximately 0.5 to 1.0 V. When the voltage Vs of the reference voltage source is negative, the component of the increase in the voltage Vp("0") can be cancelled, and when the voltage Vs is a negative voltage lower than −0.5 V, the component of the increase in the voltage Vp("0") can be perfectly cancelled. Letting VN("0") denote the new "0" level voltage owing to the provision of the reference voltage source, then VN("0")=Vp("0")−Vs. By making Vs more negative, accordingly, VN("0") can be lowered even further. Because of the existence of the junction 39, however, it is impossible to apply a voltage whose absolute value is greater than that of the built-in voltage (approximately 0.8 V) of the junction. Under this condition, the surface of the semiconductor substrate underneath the gate electrode becomes the accumulation level. Accordingly, the energy of the gate region for electrons as compared with that of the photodiode becomes higher by δVs even where the photodiode has been perfectly discharged by incident light (Vv=0 V) (refer to FIG. 4E).

$$\delta Vs = -Vs + Vb - Vp("0") \quad (4)$$

When selecting the voltage of the reference voltage source at −0.5 V and the respective values of Vb and Vp("0") at 0.8 V and 1.0 V, the difference voltage δVs becomes 0.3 V from Eq. (4). Thus, similarly to the embodiment in FIG. 3, the number of electrons flowing into the signal delivering drain can be reduced to about 1/10,000 of that in the prior art. The present system is also applicable to an imaging device having the well structure shown in FIG. 3. By setting the voltage of the well 19 to be more negative than the voltage of the well 18, a greater effect of suppressing blooming can be achieved. That is, letting Vd denote the potential difference of the well 19 relative to the well 18, a difference voltage δVs given by the following equation can be attained, and a suppressing effect greater to the extent that Vd is achieved without being limited by the reference voltage which is limited to about 0.8 V.

$$\delta Vs = -Vs + Vd + Vb - Vp("0") \quad (5)$$

EMBODIMENT 3

Figure 5:
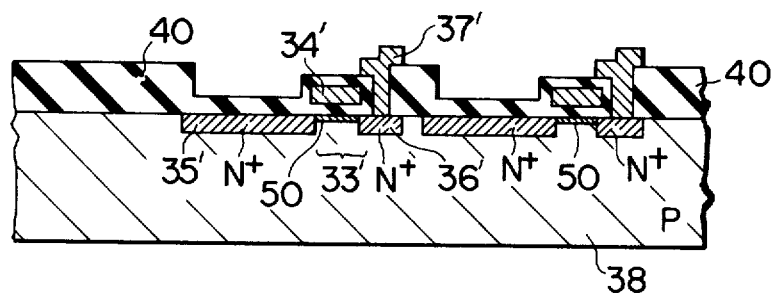
FIG. 5 is a sectional view showing the structure of a picture element of a solid-state imaging device for a third embodiment of the invention.

In the first and second embodiments described above, the surface of the semiconductor substrate underneath the gate electrode is placed at the accumulation level in such a way (1) that a positive voltage is applied to the well in which the photodiode is integrated or (2) that the scanning circuit is provided with a reference voltage source and that a "0" level voltage of the scan pulse is negative. Apart from the voltage control, substantially the same potential as the accumulation level can be formed in such a way that, as illustrated in FIG. 5, the impurity concentration of the surface of a substrate underneath a gate electrode is made high to thereby increase the number of holes (majority carriers). Numeral 50 designates a P-type impurity layer which is formed in the surface of the substrate 38 underneath the gate electrode 34' and which has a P-type impurity concentration higher than that of the substrate. The impurity layer 50 can be formed simply by an ion-implantation process after completion of the fabrication of a source and a drain and before the formation of the gate electrode, and may have its impurity concentration set at above approximately $3 \times 10^{15}$ atoms/cm$^3$ higher than the impurity concentration of the substrate (usually approximately $10^{15}$ atoms/cm$^3$). As the concentration of this impurity layer is increased, the degree of accumulation can be intensified and the effect of the invention is enhanced. Since, however, MOST 33' needs to operate at the ordinary "1" level voltage (about 10 V), it is best to keep the threshold voltage of the MOST 33' to below about 2 V and it is appropriate to keep the impurity concentration to a value below about $10^{17}$ atoms/cm$^3$.

As described above in detail, in connection with the embodiments of the invention, the solid state imaging device of the invention can conspicuously reduce or perfectly prevent electrons which flow from a photodiode through a portion underneath a gate electrode into a drain for delivering a signal output in such a way (i) that a positive voltage is applied to a well with the photodiode integrated therein, (ii) that the "0" level voltage of a vertical scan pulse is set at a negative voltage or (iii) that the impurity concentration of the portion underlying the gate electrode of a vertical switching MOST is made higher than that of a substrate. Further, as to the production of the solid-state imaging device of the invention, the embodiment of FIG. 3 can be readily manufactured by the same process as a conventional manufacturing process of the complementary MOS transistors, the embodiment of FIGS. 4A-4D by a conventional manufacturing process of N-channel MOS transistors, and the embodiment of FIG. 5 by a manufacturing process of the N-channel MOS transistors with ion implantation or the like process added thereto.

In the foregoing embodiments, N-channel MOSTs have been considered as the constituent elements. When considering P-channel MOSTs as the constituent elements, the conductivity types of impurities of the well, the substrate and the source as well as the drain and the polarities of voltages to be applied may be reversed. Needless to say, the invention is also applicable to a solid-state imaging device which employs a photodiode and a MOST for a photoelectric conversion portion and a BBD (bucket brigade device) for a scanning circuit, etc.

Figure 1:
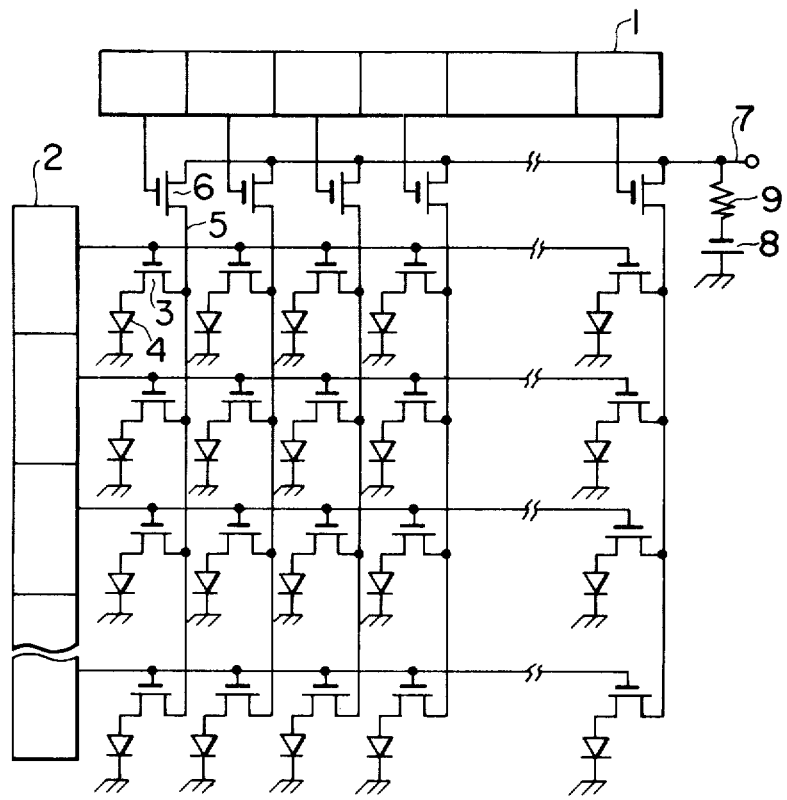
FIG. 1 is a schematic circuit diagram showing the general construction of a solid-state imaging device.

The method of deriving signals is not restricted to the system of FIG. 1, but a plurality of signal lines 7 are sometimes disposed (by way of example, three signal lines for lights of the three primary colors are disposed when the device is used for a color camera).

Depending on the scanning system or the signal deriving system, the horizontal switching MOST 7 is sometimes disposed in each photoelectric conversion unit (picture element), and a further switching MOST is disposed between the vertical switching MOST 3 and the vertical scanning circuit 2.

We claim:

1. In a solid-state imaging device having, in one major surface portion of a semiconductor substrate of a first conductivity type, a plurality of photoelectric conversion elements which are disposed in a two dimensional array, a plurality of vertical switching metal-insulator-semiconductor field effect transistors and a plurality of horizontal switching metal-insulator-semiconductor field effect transistors for selectively establishing a connection to the photoelectric conversion elements, and vertical and horizontal scanning circuits which turn the switching transistors "on" and "off," a solid-state imaging device comprising means for placing into a deeper cutoff state non-selected ones of the vertical switching metal-insulator-semiconductor field effect transistors, by placing at an accumulation level major surface regions of said semiconductor substrate underlying gate electrodes of said non-selected vertical switching metal-insulator-semiconductor field effect transistors.

2. A solid-state imaging device according to claim 1, wherein said photoelectric conversion elements and said vertical switching metal-insulator-semiconductor field effect transistors are disposed in a well region which is provided in the major surface region of said substrate and which has a conductivity type opposite to that of said substrate, and said accumulation level placing means includes means for applying a predetermined voltage to said well region.

3. A solid-state imaging device according to claim 2, wherein each of said vertical switching metal-insulator-semiconductor field effect transistors is an N-channel type element, each well region is a region of P-type conductivity, and the voltage to be applied to said well region is a positive voltage which is lower than the video voltage and the voltage applied to said substrate.

4. A solid-state imaging device according to claim 2, wherein each vertical switching metal-insulator-semiconductor field effect transistor is a P-channel type element, each well region is a region of N-type conductivity, and the voltage to be applied to said well region is a negative voltage which is higher than the video voltage and the voltage applied to said substrate.

5. A solid-state imaging device according to claim 1, wherein said means for placing into an accumulation level the major surface regions underlying gate electrodes of the vertical switching metal-insulator-semiconductor field effect transistors includes means for applying a predetermined voltage to said substrate.

6. A solid-state imaging device according to claim 5, wherein each vertical switching metal-insulator-semiconductor field effect transistor is an N-channel type element, said substrate has P-type conductivity, and the voltage to be applied to said substrate is a positive voltage whose absolute value is, at most, 0.8 V.

7. A solid-state imaging device according to claim 5, wherein each vertical switching metal-insulator-semiconductor field effect transistor is a P-channel type element, said substrate has N-type conductivity, and the voltage to be applied to said substrate is a negative voltage whose absolute value is, at most, 0.8 V.

8. A solid-state imaging device according to claim 1, wherein said means for placing into an accmulation level the major surface regions of said semiconductor substrate underlying gate electrodes of the vertical switching metal-insulator-semiconductor field effect transistors includes means for applying a "0" level voltage of a predetermined voltage to the gate electrodes of said vertical switching metal-insulator-semiconductor field effect transistors.

9. A solid-state imaging device according to claim 8, wherein each vertical switching metal-insulator-semiconductor field effect transistor is an N-channel type element, said substrate has P-type conductivity, and said predetermined voltage is a negative voltage whose absolute value is, at most, 0.8 V.

10. A solid-state imaging device according to claim 8, wherein each vertical switching metal-insulator-semiconductor field effect transistor is a P-channel type element, said substrate has N-type conductivity, and said predetermined voltage is a positive voltage whose absolute value is, at most, 0.8 V.

11. A solid-state imaging device according to claim 1, wherein the impurity concentration of said major surface regions of said semiconductor substrate underlying said gate electrodes is made higher than that of said substrate to thereby place into an accumulation level the major surface regions of said semiconductor substrate underlying gate electrodes of the vertical switching metal-insulator-semiconductor field effect transistors.

12. A solid-state imaging device according to claim 11, wherein said impurity concentration of said major surface regions of said semiconductor substrate underlying said gate electrodes of said vertical switching metal-insulator-semiconductor field effect transistors falls within a range of $3 \times 10^{15}$–$10^{17}$ atoms/cm$^3$.

* * * * *